(12) United States Patent
Yoo et al.

(10) Patent No.: US 8,860,069 B2
(45) Date of Patent: Oct. 14, 2014

(54) LIGHT-EMITTING DEVICE PACKAGE HAVING A MOLDING MEMBER WITH A LOW PROFILE, AND METHOD OF MANUFACTURING THE SAME

(75) Inventors: Cheol-jun Yoo, Chungcheongnam-do (KR); Young-hee Song, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 13/365,882

(22) Filed: Feb. 3, 2012

(65) Prior Publication Data

US 2012/0205708 A1 Aug. 16, 2012

(30) Foreign Application Priority Data

Feb. 16, 2011 (KR) ........................ 10-2011-0013678

(51) Int. Cl.
*H01L 33/00* (2010.01)
*H01L 33/48* (2010.01)
*H01L 33/60* (2010.01)

(52) U.S. Cl.
CPC .............. *H01L 33/486* (2013.01); *H01L 33/60* (2013.01); *H01L 2224/92247* (2013.01); *H01L 2224/73265* (2013.01); *H01L 2933/005* (2013.01); *H01L 2224/48091* (2013.01)
USPC 257/99; 257/100; 257/E33.057; 257/E33.066; 438/26

(58) Field of Classification Search
CPC ..... H01L 33/486; H01L 33/62; H01L 33/642; H01L 33/48; H01L 33/483; H01L 33/50; H01L 33/64
USPC ........ 257/99, 100, E33.057, E33.066; 438/26
See application file for complete search history.

(56) References Cited

U.S. PATENT DOCUMENTS

| 8,415,681 B2 * | 4/2013 | Takada ............................ 257/79 |
| 2004/0000727 A1 | 1/2004 | Hsu |
| 2006/0091410 A1 | 5/2006 | Chen |
| 2006/0220048 A1 * | 10/2006 | Matsumoto et al. ............ 257/98 |

FOREIGN PATENT DOCUMENTS

KR 10-2010-0003318 A 1/2010

* cited by examiner

*Primary Examiner* — Minh-Loan T Tran
(74) *Attorney, Agent, or Firm* — McDermott Will & Emery LLP

(57) ABSTRACT

A light-emitting device package. The light-emitting device package includes a lead frame comprising a plurality of separate leads; a molding member that fixes the plurality of leads and comprises an opening portion that exposes the lead frame; and a light-emitting device chip that is attached on the lead frame in the opening portion and emits light through an upper surface portion of the light-emitting device chip, wherein a height of the molding member is lower than a height of the light-emitting device chip with respect to the lead frame.

20 Claims, 8 Drawing Sheets

LIGHT-EMITTING DEVICE PACKAGE HAVING A MOLDING MEMBER WITH A LOW PROFILE, AND METHOD OF MANUFACTURING THE SAME

CROSS-REFERENCE TO RELATED APPLICATIONS

This application claims the benefit of Korean Patent Application No. 10-2011-0013678, filed on Feb. 16, 2011, in the Korean Intellectual Property Office, the disclosure of which is incorporated herein in its entirety by reference.

BACKGROUND

1. Field

The present disclosure relates to light-emitting device packages and methods of manufacturing the same, and more particularly, to light-emitting device packages having an improved structure of a molding member and methods of manufacturing the light-emitting device packages.

2. Description of the Related Art

Semiconductor light-emitting devices such as a light-emitting diode (LED) or a laser diode (LD) operate using an electroluminescence phenomenon, that is, a phenomenon that light is emitted from a material (semiconductor) to which a current or a voltage is applied, and are manufactured using compound semiconductors. For example, a nitride gallium-based light-emitting device is widely used as a high efficiency and high luminance device. A semiconductor light-emitting device such as a LED has a longer lifespan, compared to other light-emitting units and is operated at a low voltage and at low power consumption. In particular, the semiconductor light-emitting devices have high response speeds and impact resistance and are compact and light. As the semiconductor light-emitting devices are capable of emitting light of various wavelengths according to the type and composition of semiconductors used, light of different wavelengths may be generated according to necessity. Recently, an illuminating apparatus using a high luminance light-emitting device chip has been replacing phosphorescent lamps or incandescent lamps.

To provide illuminating apparatuses using the above-described semiconductor light-emitting devices, a packaging operation of connecting a light-emitting device chip to a lead frame and encapsulating the same needs to be performed. For example, in a packaging operation of a typical light-emitting device, a lead frame in which a cup-shaped molding member is pre-molded is first provided. Then, a light-emitting device chip is adhered to the lead frame inside the molding member to conduct wire bonding thereto, a phosphor is filled inside the molding member to surround the light-emitting device chip, and finally, a light-emitting member having a lens shape is formed over the molding member for encapsulation to thereby manufacture a light-emitting device package.

SUMMARY

Provided are light-emitting device packages including a molding member having an improved structure in regards to the limitations of the material of the molding member and methods of manufacturing the light-emitting device packages.

Additional aspects will be set forth in part in the description which follows and, in part, will be apparent from the description, or may be learned by practice of the presented embodiments.

According to an aspect of the present invention, a light-emitting device package includes: a lead frame including a plurality of leads that are separated from each other; a molding member that fixes the plurality of leads and includes an opening portion that exposes a portion of an upper surface of the lead frame; and a light-emitting device chip that is attached on the lead frame in the opening portion and emits light through an upper surface of the light-emitting device chip, wherein a height of the molding member is lower than a height of the light-emitting device chip with respect to the lead frame. Thus, as the height of the molding member is lower than the height of the light-emitting device chip, the molding member is not an obstacle to light emitted from the light-emitting device chip, and the material of the molding member is not limited. Accordingly, the molding member may include a colored resin. For example, the molding member may include an epoxy molding compound.

An area of the molding member that is adjacent to the opening portion may be inclined.

A lead to which the light-emitting device chip is attached and at least two leads used for electrical wiring of the light-emitting device chip may be different from each other. A gap between the plurality of leads may have a upwardly or downwardly stepped structure.

The light-emitting device chip may be attached to one of at least two leads used for electrical wiring of the light-emitting device chip. At least one through-hole may be formed in the lead frame, and the molding member may be formed through the at least one through-hole. The at least one through-hole may have an upper portion that is either broader or narrower than a lower portion.

A lower surface of the lead frame may be exposed to the outside, thereby increasing heat dissipation efficiency.

The light-emitting device package may further include a phosphor layer formed on the upper surface of the light-emitting device chip.

The light-emitting device package may further include a lens disposed on an upper portion of the light-emitting device chip.

According to another aspect of the present invention, a method of manufacturing a light-emitting device package, includes: forming a lead frame including a plurality of leads that are separated from each other; forming a molding member on the lead frame such that the molding member has an opening portion that exposes a portion of an upper surface of the lead frame and fixes the plurality of leads; and attaching a light-emitting device chip on the lead frame in the opening portion, wherein a height of the molding member is lower than a height of the light-emitting device chip with respect to the lead frame.

The molding member may be formed of a colored resin. The molding member may be formed of an epoxy molding compound.

An area of the molding member that is adjacent to the opening portion may be inclined.

The plurality of leads may be formed such that a gap between the plurality of leads has an upwardly or downwardly stepped structure.

At least one through-hole may be formed in the lead frame, and the molding member may be filled in the at least one through-hole. The at least one through-hole may have an upper portion that is either broader or narrower than a lower portion.

The molding member may not be formed on a lower surface of the lead frame so that the lower surface of the lead frame is exposed to the outside.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
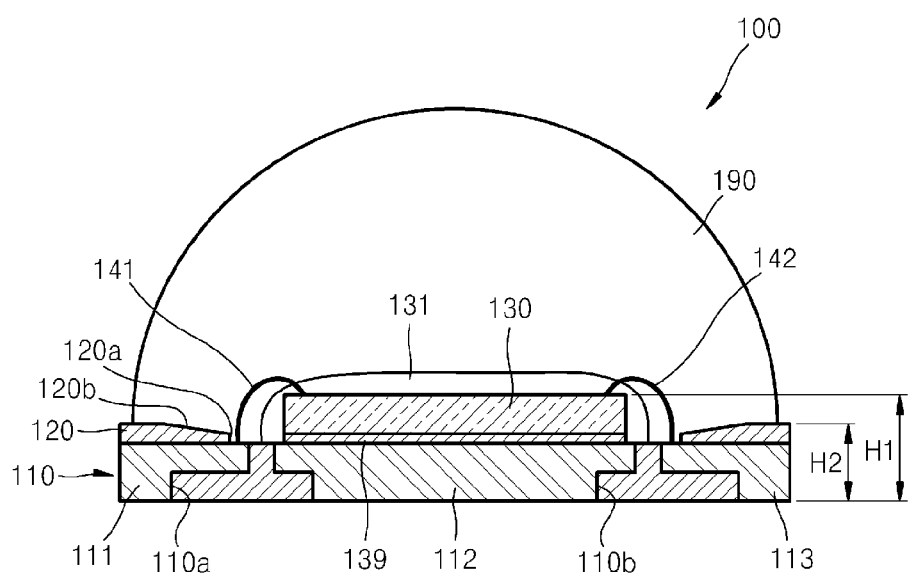
FIG. 1 is a schematic cross-sectional view of a light-emitting device package according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions are exaggerated for clarity, and like reference numerals in the drawings denote like elements.

Figure 2A:
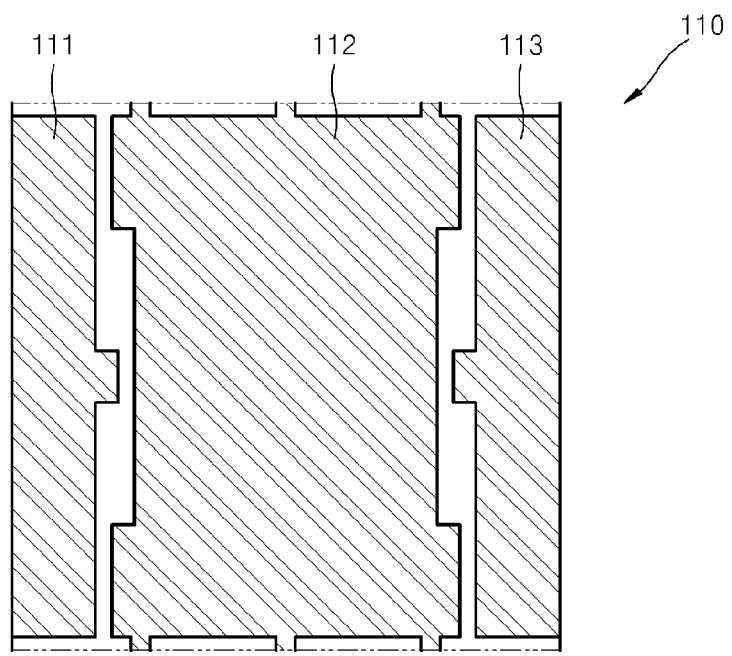
FIG. 2A is a plan view of a lead frame of the light-emitting device package of FIG. 1, according to an embodiment of the present invention.
Figure 2B:
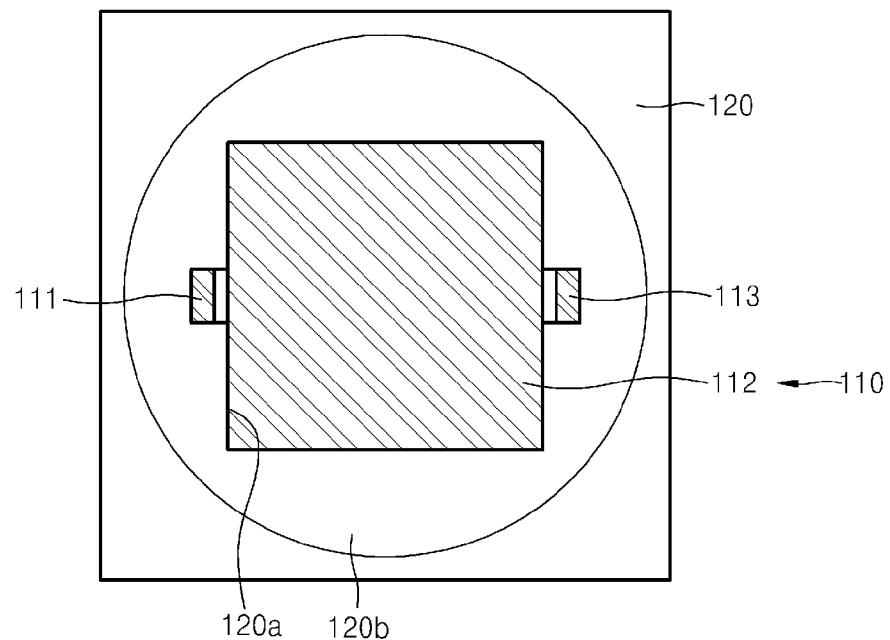
FIG. 2B is a plan view illustrating the lead frame of FIG. 2 on which a molding member is formed.
Figure 2C:
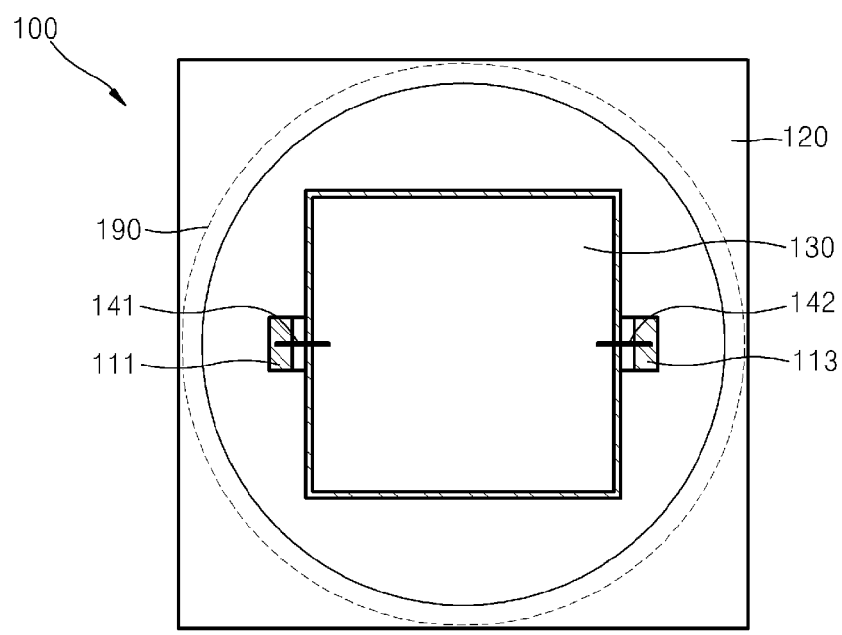
FIG. 2C is a plan view illustrating the lead frame to which a light-emitting device chip is attached.

FIG. 1 is a schematic cross-sectional view of a light-emitting device package 100 according to an embodiment of the present invention. FIG. 2A is a plan view of a lead frame 110 of the light-emitting device package 100 of FIG. 1, according to an embodiment of the present invention. FIG. 2B is a plan view illustrating the lead frame 110 of FIG. 2 on which a molding member 120 is formed. FIG. 2C is a plan view illustrating the lead frame 110 to which a light-emitting device chip 130 is attached.

Referring to FIG. 1 and FIGS. 2A through 2C, the light-emitting device package 100 is a pre-mold type package in which the molding member 120 is formed before a light-emitting device chip 130 is attached through an opening portion 120a to the molding member 120.

The light-emitting device package 100 includes the lead frame 110, the light-emitting device chip 130 mounted on the lead frame 110, and the molding member 120 that fixes the lead frame 110.

The lead frame 110 includes first through third leads 111, 112, and 113 that are separate from one another. The first through third leads 111, 112, and 113 may be metal plates in the form illustrated in FIG. 2A. The first through third leads 111, 112, and 113 are separated from one another by predetermined gaps 110a and 110b, and thus, are electrically insulated from one another. The gaps 110a and 110b are filled with the molding member 120, thereby enhancing mechanical coupling force between the lead frame 110 and the molding member 120. Furthermore, a lower portion of the gaps 110a and 110b over which the light-emitting device chip 130 of the lead frame 110 is attached may be broader than an upper portion thereof. For example, as illustrated in FIG. 1, the gaps 110a and 110b may have steps such that a lower portion thereof is broader than an upper portion thereof. Consequently, the steps of the gaps 110a and 110b may further enhance mechanical coupling force between the lead frame 110 and the molding member 120. A bonding pad 139 may be disposed on the second lead 112 to bond the light-emitting device chip 130 to the lead frame 110. Two electrodes of the light-emitting device chip 130 are electrically connected to the separate first and third leads 111 and 113 via bonding wires 141 and 142, respectively.

As illustrated in FIG. 2B, the molding member 120 encapsulates an upper portion of the lead frame 110 and not a predetermined opening portion 120a. A height H2 of the molding member 120 is set to be lower than a height H1 of the light-emitting device chip 130. As the height H2 of the molding member 120 is lower than the height H1 of the light-emitting device chip 130, the molding member 120 is not an obstacle to light emitted from an upper surface of the light-emitting device chip 130, that is, a light emission surface. Thus, a molding material of the molding member 120 is not limited to white materials and colored resins may also be used to form the molding member 120 instead of white materials. For example, the molding member 120 may be formed of a well-known integrated circuit (IC) molding resin. For example, an epoxy molding compound (EMC), which is a typical IC molding resin, is cost-effective and has high mechanical properties, high adhesiveness, high heat resistance, and high flame resistance, and thus, may be used to form the molding member 120. In a general lead frame type light-emitting device package, a light-emitting device chip is positioned in an opening portion of a molding member, and thus, the molding member is formed of a white molding material in which a material such as $TiO_2$ is mixed to provide a light reflection function. However, the white molding material is discolored due to heat that is generated when a light-emitting device chip operates, and discoloration of the molding member is the main factor that decreases luminance of the general lead frame type light-emitting device package. In contrast, the light-emitting device package 100 according to the embodiment of the present invention includes the molding member 120, which has the height H2 that is lower than the height H1 of the light-emitting device chip 130, and thus is not limited by discoloration, and also, any material may be used to form the molding member 120. Obviously, not only colored molding materials but also high reflectivity white molding materials may be used as the material of the molding member 120.

Alternatively, the molding member 120 may not be formed on a lower surface of the lead frame 110. The gaps 110a and 110b of the lead frame 110 have a stepped structure in which a lower portion thereof is broader than an upper portion thereof, and since the gaps 110a and 110b are filled with the molding member 120, even when the molding member 120 is not formed on the lower surface of the lead frame 110, the lead frame 110 and the molding member 120 are stably coupled to each other. As the lower surface of the lead frame 110 is exposed, heat generated in the light-emitting device chip 130 may be efficiently discharged without having to attach a heat dissipation member such as a heat sink. Also, as the lower surface of the lead frame 110 is exposed, a solder resist (not shown) and a solder bump (not shown) may be formed on lower surfaces of the first lead 111 and the third lead 113 to provide an electrical wiring connected to the outside.

The opening portion 120a has space for wire bonding with the light-emitting device chip 130. The most of the opening portion 120a may have a rectangular shape to correspond to the rectangular shape of the light-emitting device chip 130 so as to provide a light emission area as large as possible, as illustrated in FIGS. 2B and 2C. In FIGS. 2B and 2C, bonding wires are attached to the exposed portions of the first lead 111 and the third lead 113. According to circumstances, the shape of the opening portion 120a may be a circle or other various shapes. Furthermore, in order not to be an obstacle to light emitted from the light-emitting device chip 130, an adjacent area 120b of the opening portion 120a of the molding member 120 may be inclined. The outline of the inclined adjacent area 120b may be circular to correspond to the outer shape of a lens 190, as illustrated in FIGS. 2B and 2C.

The light-emitting device chip 130 emits light through its upper surface, that is, the light emission surface, and may be, for example, a light emitting diode (LED) or a laser diode (LD). As illustrated in FIG. 1, the light-emitting device chip 130 is disposed in the opening portion 120a that is not encapsulated by the molding member 120. The light-emitting device chip 130 may be electrically connected to the exposed portions of the first and third leads 111 and 113 via the bonding wires 141 and 142. Also, a phosphor layer 131 may be further coated on the light emission surface of the light-emitting device chip 130, which is the upper surface of the light-emitting device chip 130. The phosphor layer 131 is excited by light emitted from the light-emitting device chip 130 to generate white light. To this end, the phosphor layer 131 may be formed by dispersing a single type or multiple types of phosphors in a resin according to a predetermined combination ratio. The type and combination ratio of phosphors dispersed in a resin such as a silicon resin or an epoxy resin may be selected according to light emission characteristics of the light-emitting device chip 130. The phosphor layer 131 may be coated completely over the light emission surface of the light-emitting device chip 130, which is the upper surface of the light-emitting device chip 130. However, if white light emission is not required, the phosphor layer 131 may be omitted. According to circumstances, the phosphor layer 131 may be attached to the light emission surface of the light-emitting device chip 130 in the form of a film.

The lens 190 is disposed over the light-emitting device chip 130. The lens 190 may be formed of a transparent polymer molding material using an ejection molding method so as to encapsulate both the light-emitting device chip 130 and the bonding wires 141 and 142. According to circumstances, a specially designed lens 190 may be attached over the molding member 120. In FIG. 1, although the lens 190 is illustrated having a hemispheric shape, the shape of the lens 190 is not limited thereto and the lens 190 having various shapes may be used according to required light directivities.

Figure 3:
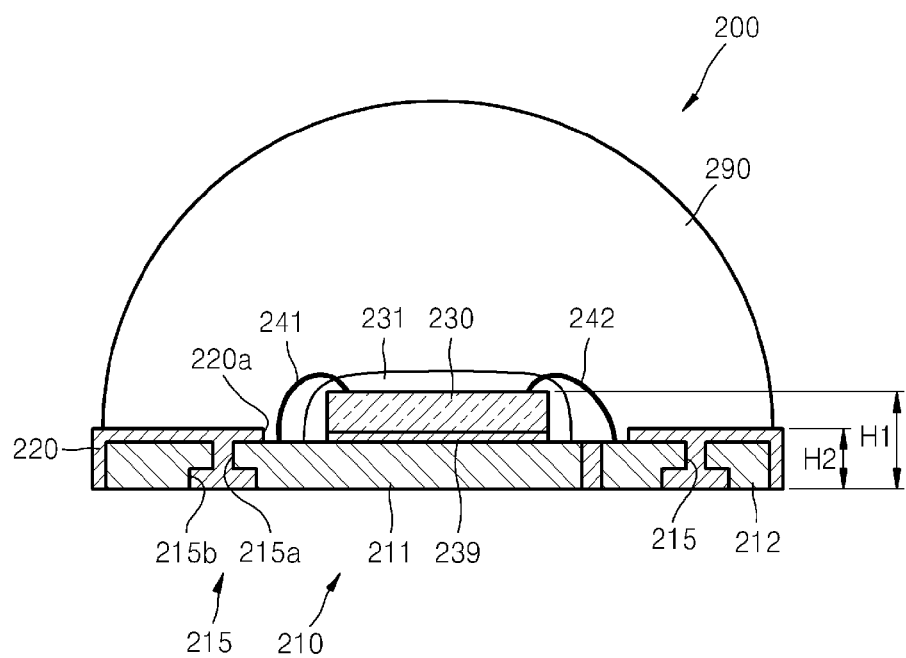
FIG. 3 is a schematic cross-sectional view illustrating a light-emitting device package according to another embodiment of the present invention.
Figure 4A:
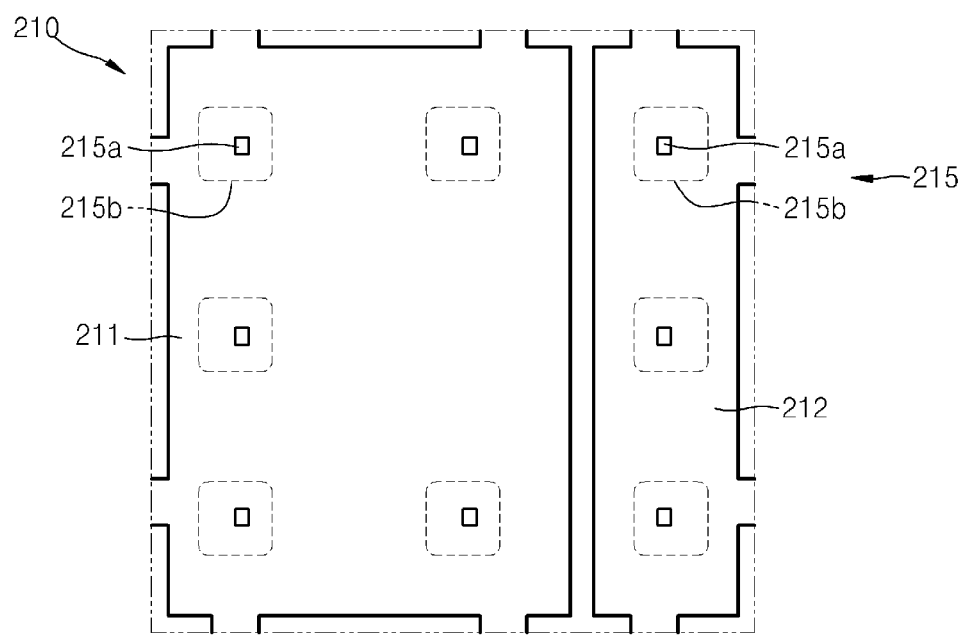
FIG. 4A is a plan view illustrating a lead frame of the light-emitting device package of FIG. 3, according to an embodiment of the present invention.
Figure 4B:
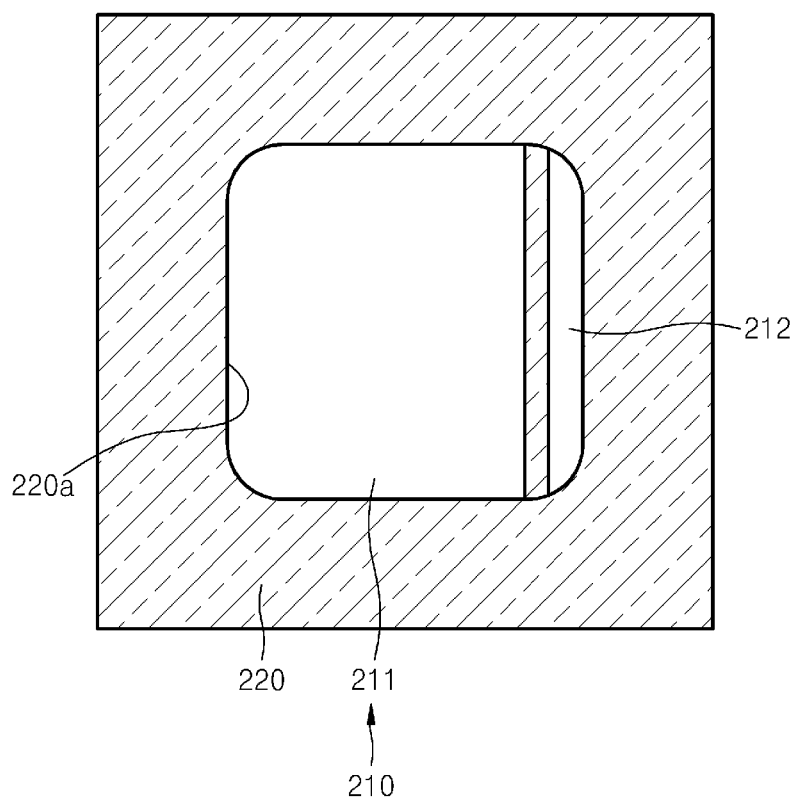
FIG. 4B is a plan view illustrating the lead frame of FIG. 4A to which a light-emitting device chip is attached.
Figure 4C:
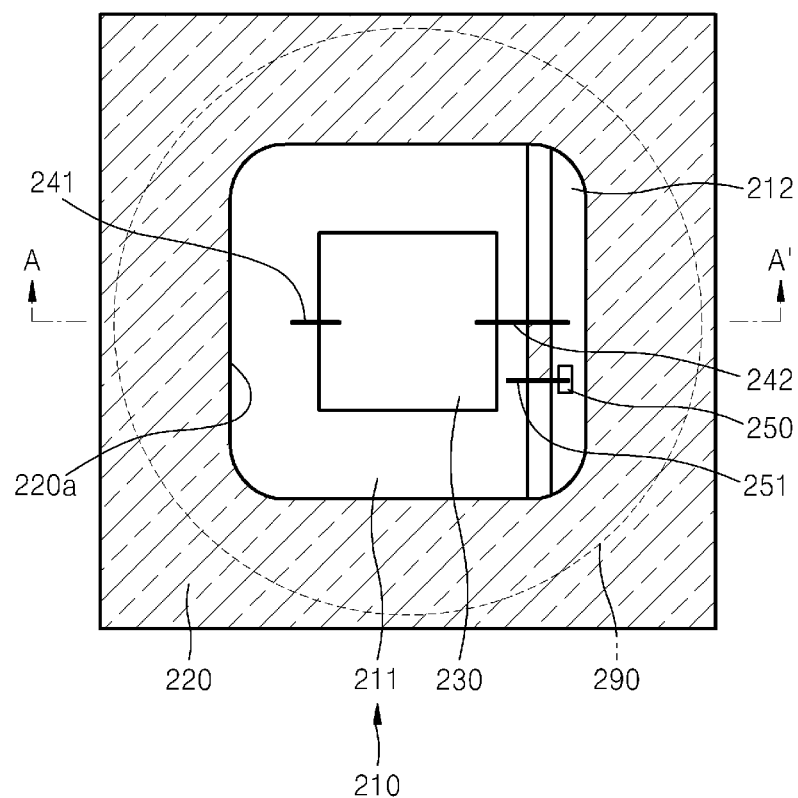
FIG. 4C is a plan view illustrating the lead frame of FIG. 4B on which a molding member is formed.

FIG. 3 is a schematic cross-sectional view illustrating a light-emitting device package 200 according to another embodiment of the present invention. FIG. 4A is a plan view illustrating a lead frame 210 of the light-emitting device package 200 of FIG. 3, according to an embodiment of the present invention. FIG. 4B is a plan view illustrating the lead frame 210 of FIG. 4A on which a light-emitting device chip 230 is attached. FIG. 4C is a plan view illustrating the lead frame 210 of FIG. 4B on which a molding member 220 is formed.

Referring to FIG. 3 and FIGS. 4A through 4C, the light-emitting device package 200 includes the lead frame 210, the light-emitting device chip 230 mounted on the lead frame 210, and the molding member 220 that fixes the lead frame 210.

The lead frame 210 includes first and second leads 211 and 212 that are separate from each other. The first and second leads 211 and 212 may be metal plates in the form illustrated in FIG. 4A. The first and second leads 211 and 212 are separated from each other by a predetermined gap, and thus, are electrically insulated from each other. The light-emitting device package 200 is different from the light-emitting device package 100 of the previous embodiment in that a bonding pad 239 is formed on the first lead 211, to which the light-emitting device chip 230 is adhered. According to the previous embodiment, the second lead 112 to which the light-emitting device chip 130 of FIG. 1 is attached is separated from the first and third leads 111 and 113, but in the light-emitting device package 200 according to the current embodiment, the bonding pad 239 is formed on the first lead 211 used for electrical wiring, and thus, areas of the first and second leads 211 and 212 are relatively broader than the first and second leads 111 and 112 of the previous embodiment, and thus, a light emission area is increased.

At least one through-hole 215 may be formed in an area of the lead frame 210 except an area where the light-emitting device chip 230 and the bonding wires 241 and 242 are attached. The through-hole 215 may be filled with the molding member 220 so as to increase mechanical coupling force between the lead frame 210 and the molding member 220. Furthermore, the through-hole 215 may have a stepped structure in which a lower portion 215b of the lead frame 210 is broader than an upper portion 215a of the lead frame 210, which is where the light-emitting device chip 230 is attached. The stepped structure of the through-hole 215 may further enhance mechanical coupling force between the lead frame 210 and the molding member 220. Accordingly, the molding member 220 may not be formed on a lower surface of the lead frame 210, and as the lower surface of the lead frame 210 is exposed, heat generated in the light-emitting device chip 230 may be efficiently discharged without having to attach an additional heat dissipation member such as a heat sink.

As illustrated in FIG. 4B, the molding member 220 encapsulates an upper portion of the lead frame 210 except an area of a predetermined opening portion 220a. A height H2 of the molding member 220 is set to be lower than a height H1 of the light-emitting device chip 230. As the height H2 of the molding member 220 is lower than the height H1 of the light-emitting device chip 230, the molding member 220 is not an obstacle to light emitted from an upper surface of the light-emitting device chip 230, that is, a light emission area. Accordingly, a molding material of the molding member 220 is not limited to white materials. For example, the molding member 220 may be formed of a colored resin such as EMC. Also, high reflectivity white molding materials may be used to form the molding member 220.

An opening portion 220a has space for wire bonding with the light-emitting device chip 230. That is, a portion of the first lead 211 to which the light-emitting device chip 230 and a bonding wire 241 may be attached and a portion of the second lead 212 to which the other bonding wire 241 may be attached are exposed through the opening portion 220a. The light-emitting device chip 230 may be a LED or a LD. The light-emitting device chip 230 may be electrically connected to the exposed portions of the first and second leads 211 and 212 via the bonding wires 241 and 242. A phosphor layer 231 may be further coated on the light emission surface of the light-emitting device chip 230, which is the upper surface of the light-emitting device chip 230.

Furthermore, a Zener diode 250 and a wiring space for the Zener diode 250 may be formed in the opening portion 220a. The Zener diode 250 is a diode in which electric current flows when a potential difference equal to or greater than a Zener voltage is applied in an inverse direction. An electrode of the Zener diode 250 is electrically connected to the first lead 211 by being directly attached to the first lead 211, and the other electrode of the Zener diode 250 is electrically connected to the second lead 212 via a bonding wire 251. That is, the Zener diode 250 and the light-emitting device chip 230 are connected to each other in parallel. Accordingly, if an overvoltage is generated, a current flows through the Zener diode 250, and thus, the Zener diode 250 protects the light-emitting device chip 230 from the overvoltage.

A lens 290 may be disposed over the light-emitting device chip 230. The lens 290 may be formed of a transparent polymer molding material using an injection molding method to encapsulate all of the light-emitting device chip 230, the Zener diode 250, and the bonding wires 241, 242, and 251.

Figure 5:
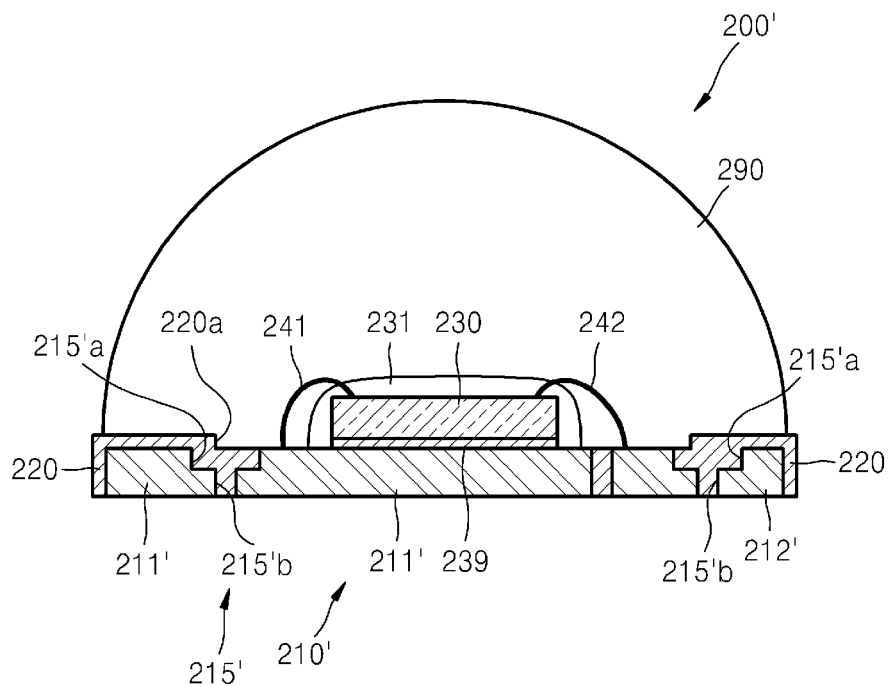
FIG. 5 illustrates a modification example of the light-emitting device package of FIG. 3.

FIG. 5 illustrates a light-emitting device package 200' which is a modification example of the light-emitting device package 200 of FIG. 3.

Referring to FIG. 5, the form of a through-hole 215' of the light-emitting device package 200' is different from that of the through-hole 215 of the light-emitting device package 200 of FIG. 3. That is, the through-hole 215' has a stepped structure in which a lower portion 215'b of the lead frame 210' is smaller than an upper portion 215'a of the lead frame 210', which is where the light-emitting device chip 230 is attached. The stepped form of the through-hole 215' may provide relatively smaller mechanical coupling force than in the light-emitting device package 200 of FIG. 3 but still provides efficient mechanical coupling force between the lead frame 210' and the molding member 220 even though the molding member 220 is not formed on a lower surface of the lead frame 210'. In addition, as the lower portion 215'b is smaller than the upper portion 215'a of the through-hole 215', an area exposed at the lower surface of the lead frame 210' has become relatively larger than that of the light-emitting device package 200, and thus, a heat discharging efficiency of the light-emitting device package 200' may be further improved. Also, as the upper portion 215'a of the through-hole 215' is broader than the lower portion 215'b of the through-hole 215', an opening portion 220a having a large area such that a portion of the upper area 215'a of the through-hole 215' is exposed may be formed. That is, according to the current modification example of the present invention, without increasing the size of the light-emitting device package 200', the opening portion 220a having sufficient space that is not an obstacle to proceeding light emitted from the light-emitting device chip 230 may be provided.

FIGS. 6A through 6F illustrate a method of manufacturing a light-emitting device package, according to an embodiment of the present invention. The light-emitting device package manufactured using the method of manufacturing according to the current embodiment of the present invention is the light-emitting device package 100 described with reference to FIGS. 1 through 3.

Figure 6A:
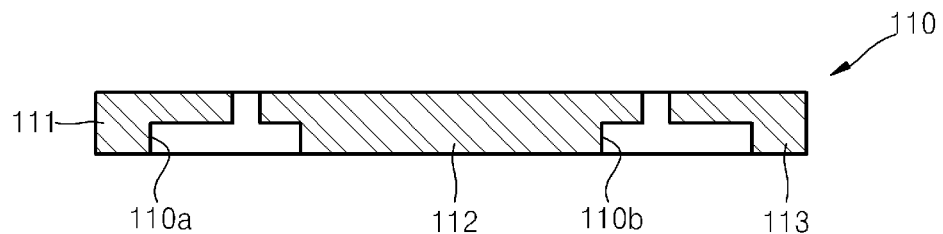
FIGS. 6A through 6F illustrate a method of manufacturing a light-emitting device package, according to an embodiment of the present invention.

Referring to FIG. 6A, first, a lead frame 110 is provided. The lead frame 110 may be formed by processing a metal plate to the forms of first through third leads 111, 112, and 113 by, for example, etching. In the lead frame 110, gaps 110a and 110b are formed so that the first through third leads 111, 112, and 113 are separated from one another. The gaps 110a and 110b may be formed to have a stepped structure so that lower portions thereof are broader than upper portions thereof, by performing half-etching.

Figure 6B:
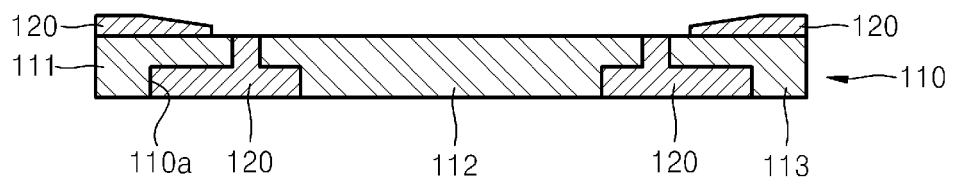
Figure 6C:
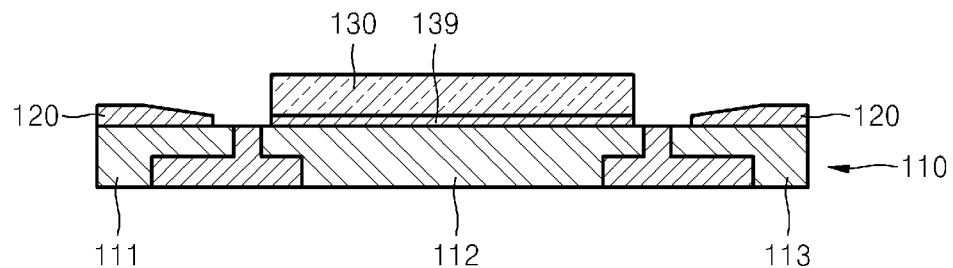

Next, referring to FIG. 6B, a molding member 120 is formed on the lead frame 110 using an injection molding method. That is, the light-emitting device package 100 is a pre-mold package in the manufacture where the molding member 120 is formed before a light-emitting device chip 130 of FIG. 6C is attached. For example, the lead frame 110 is disposed inside a mold frame, and the molding frame 120 may be formed by using an injection molding method such as transfer molding. The molding member 120 fills the gaps 110a and 110b of the lead frame 110 so that the first through third leads 111, 112, and 113 are coupled and fixed to one another. A height of the molding member 120 is set to be lower than a height of the light-emitting device chip 130 that is to be attached, as described with reference to FIG. 1.

Figure 6D:
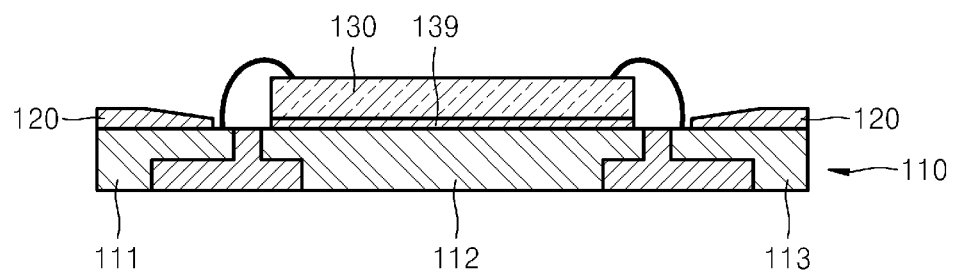

Next, referring to FIGS. 6C and 6D, the light-emitting device chip 130 is attached to the lead frame 110 and is wired with bonding wire 141 and 142 thereon. According to the current embodiment, the lead frame 110 is divided into three pieces; a bonding pad 139 to which the light-emitting device chip 130 is to be attached is formed on the second lead 112 in the center to attach the light-emitting device chip 130 to the bonding pad 139. In addition, a bonding pad to which the bonding wires 141 and 142 are to be bonded are formed on each of the first lead 111 and the third lead 113 on the two sides such that an upper portion of the attached light-emitting device chip 130 and the first lead 111 and the third lead 113 are connected to each other via the bonding wires 141 and 142.

Figure 6E:
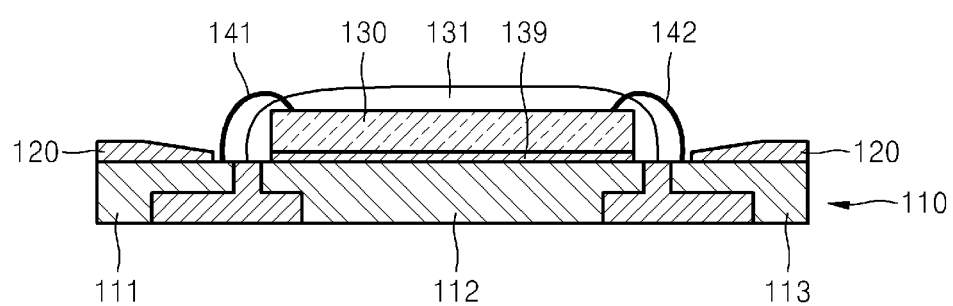

Next, referring to FIG. 6E, the upper portion of the light-emitting device chip 130 or the upper portion and lateral portions of the light-emitting device chip 130 are coated with a phosphor layer 131. According to circumstances, the phosphor layer 131 may be formed in advance as a sheet and adhered to the upper portion of the light-emitting device chip 130.

Figure 6F:
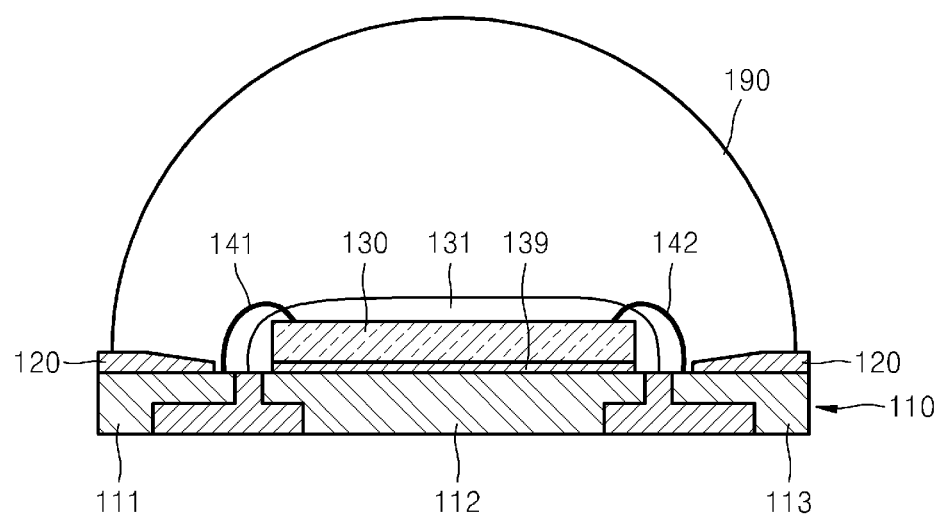

Next, referring to FIG. 6F, a lens 190 is formed on the molding member 120. The lens 190 may be formed of a transparent polymer molding material using an ejection molding method so as to encapsulate both the light-emitting device chip 130 and the bonding wires 141 and 142. According to circumstances, a specially designed lens 190 may be attached to the molding member 120.

As described above, according to the one or more of the above embodiments of the present invention, a molding member having a lower height than an upper portion of a light-emitting device chip is applied, and thus, a decrease in luminance due to the deterioration of the molding member is not caused, thereby manufacturing a high reliability light-emitting device package. In addition, a light reflection function by using the molding member is not necessary, and thus, various, cost-effective molding materials having various functions may be used as the material of the molding member.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:
1. A light-emitting device package comprising:
   a lead frame comprising a plurality of leads that are separated from each other;

a molding member that fixes the plurality of leads and comprises an opening portion that exposes a portion of an upper surface of the lead frame; and a light-emitting device chip that is attached on the lead frame in the opening portion and emits light through an upper surface of the light-emitting device chip, wherein a height of the molding member is lower than a height of the light-emitting device chip with respect to the lead frame, and an area of the molding member that is adjacent to the opening portion is inclined.

2. The light-emitting device package of claim 1, wherein the molding member comprises a colored resin.

3. The light-emitting device package of claim 2, wherein the molding member comprises an epoxy molding compound.

4. The light-emitting device package of claim 1, wherein the area of the molding member that is adjacent to the opening portion is inclined with respect to the upper surface of the lead frame, and an outline of the inclined adjacent area of the molding member is circular.

5. The light-emitting device package of claim 1, wherein a lead to which the light-emitting device chip is attached and at least two leads used for electrical wiring of the light-emitting device chip are different from each other.

6. The light-emitting device package of claim 5, wherein a gap between the plurality of leads has a upwardly or downwardly stepped structure.

7. The light-emitting device package of claim 1, wherein the light-emitting device chip is attached to one of at least two leads used for electrical wiring of the light-emitting device chip.

8. The light-emitting device package of claim 7, wherein at least one through-hole is formed in the lead frame, and the molding member is formed through the at least one through-hole.

9. The light-emitting device package of claim 8, wherein the at least one through-hole has an upper portion that is either broader or narrower than a lower portion.

10. The light-emitting device package of claim 1, wherein a lower surface of the lead frame is exposed to the outside.

11. The light-emitting device package of claim 1, further comprising a phosphor layer formed on the upper surface of the light-emitting device chip.

12. The light-emitting device package of claim 1, further comprising a lens disposed on an upper portion of the light-emitting device chip.

13. A method of manufacturing a light-emitting device package, the method comprising:

forming a lead frame comprising a plurality of leads that are separated from each other;

forming a molding member on the lead frame such that the molding member has an opening portion that exposes a portion of an upper surface of the lead frame and fixes the plurality of leads; and attaching a light-emitting device chip on the lead frame in the opening portion, wherein a height of the molding member is lower than a height of the light-emitting device chip with respect to the lead frame, and an area of the molding member that is adjacent to the opening portion is inclined.

14. The method of claim 13, wherein the molding member is formed of a colored resin.

15. The method of claim 14, wherein the molding member is formed of an epoxy molding compound.

16. The method of claim 13, wherein the area of the molding member that is adjacent to the opening portion is inclined with respect to the upper surface of the lead frame, and an outline of the inclined adjacent area of the molding member is circular.

17. The method of claim 13, wherein the plurality of leads are formed such that a gap between the plurality of leads has an upwardly or downwardly stepped structure.

18. The method of claim 13, wherein at least one through-hole is formed in the lead frame, and the molding member is filled in the at least one through-hole.

19. The method of claim 18, wherein the at least one through-hole has an upper portion that is either broader or narrower than a lower portion.

20. The method of claim 13, wherein the molding member is not formed on a lower surface of the lead frame so that the lower surface of the lead frame is exposed to the outside.

* * * * *